United States Patent
Harumoto et al.

(10) Patent No.: US 10,395,942 B2
(45) Date of Patent: Aug. 27, 2019

(54) ETCHING DEVICE, SUBSTRATE PROCESSING APPARATUS, ETCHING METHOD AND SUBSTRATE PROCESSING METHOD

(71) Applicant: SCREEN Holdings Co., Ltd., Kyoto (JP)

(72) Inventors: Masahiko Harumoto, Kyoto (JP); Koji Kaneyama, Kyoto (JP); Yuji Tanaka, Kyoto (JP); Masaya Asai, Kyoto (JP)

(73) Assignee: SCREEN Holdings Co., Ltd. (JP)

( * ) Notice: Subject to any disclaimer, the term of this patent is extended or adjusted under 35 U.S.C. 154(b) by 0 days.

(21) Appl. No.: 15/696,611

(22) Filed: Sep. 6, 2017

(65) Prior Publication Data

US 2018/0076056 A1 Mar. 15, 2018

(30) Foreign Application Priority Data

Sep. 15, 2016 (JP) .................. 2016-180856

(51) Int. Cl.
*H01L 21/311* (2006.01)
*H01L 21/02* (2006.01)
(Continued)

(52) U.S. Cl.
CPC .. *H01L 21/31133* (2013.01); *H01L 21/02118* (2013.01); *H01L 21/02348* (2013.01);
(Continued)

(58) Field of Classification Search
CPC ........... H01L 21/6708; H01L 21/02118; H01L 21/02348; H01L 21/31133; H01L 21/67225; H01L 21/68764
See application file for complete search history.

(56) References Cited

U.S. PATENT DOCUMENTS

2009/0032067 A1* 2/2009 Kojimaru .......... H01L 21/67028
134/26
2012/0264308 A1* 10/2012 Watanabe ........... H01L 21/3105
438/757
(Continued)

FOREIGN PATENT DOCUMENTS

JP 2013-232621 A 11/2013
JP 5918122 B2 5/2016
(Continued)

OTHER PUBLICATIONS

Office Action dated Sep. 21, 2018 in corresponding Korean Patent Application No. 10-2017-0117110.
(Continued)

*Primary Examiner* — Feifei Yeung Lopez
(74) *Attorney, Agent, or Firm* — Ostrolenk Faber LLP

(57) ABSTRACT

During a first period, pure water used as a low-volatile liquid is supplied onto a substrate while the substrate is rotated. After discharge of the low-volatile liquid is stopped, the low-volatile liquid remains in a large region on a DSA film. The low-volatile liquid is held on the DSA film without reacting with the DSA film. During a subsequent second period, an organic solvent is supplied to the substrate while the substrate is rotated. The organic solvent supplied to the substrate is mixed with the low-volatile liquid remaining on the DSA film. In this case, volatilization of the organic solvent is inhibited on the DSA film.

14 Claims, 11 Drawing Sheets

(51) Int. Cl.
*H01L 21/67* (2006.01)
*H01L 21/687* (2006.01)

(52) U.S. Cl.
CPC .... *H01L 21/6708* (2013.01); *H01L 21/67225* (2013.01); *H01L 21/68764* (2013.01)

(56) References Cited

U.S. PATENT DOCUMENTS

| | | |
|---|---|---|
| 2014/0022521 A1 | 1/2014 | Harumoto et al. ............. 355/27 |
| 2015/0062545 A1 | 3/2015 | Muramatsu et al. ........... 355/30 |
| 2015/0187561 A1* | 7/2015 | Frank ................ H01L 21/67051 |
| | | 134/26 |
| 2016/0047053 A1* | 2/2016 | Sugishima ................ C23F 1/38 |
| | | 438/669 |
| 2016/0289839 A1 | 10/2016 | Harumoto et al. |
| 2018/0033638 A1* | 2/2018 | Ku .................... H01L 21/31133 |
| 2018/0044795 A1 | 2/2018 | Harumoto et al. |

FOREIGN PATENT DOCUMENTS

| | | |
|---|---|---|
| KR | 10-2016-0101464 | 8/2016 |
| TW | 201306115 A | 2/2013 |
| TW | 201409536 A | 3/2014 |

OTHER PUBLICATIONS

Office Action dated dated Nov. 29, 2018 in corresponding Taiwanese Patent Application No. 106130754.

\* cited by examiner

F I G. 6
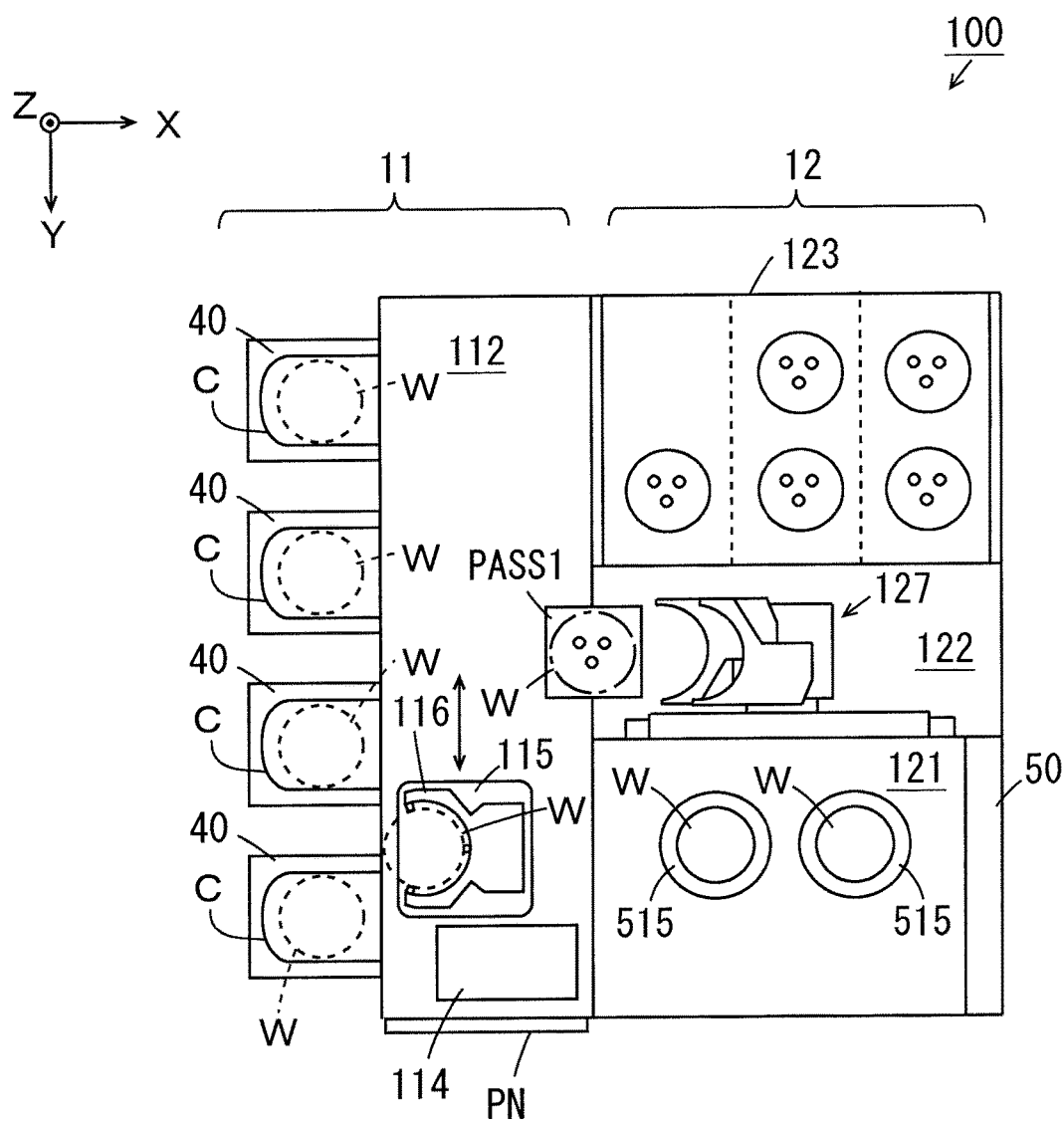

F I G. 1 0
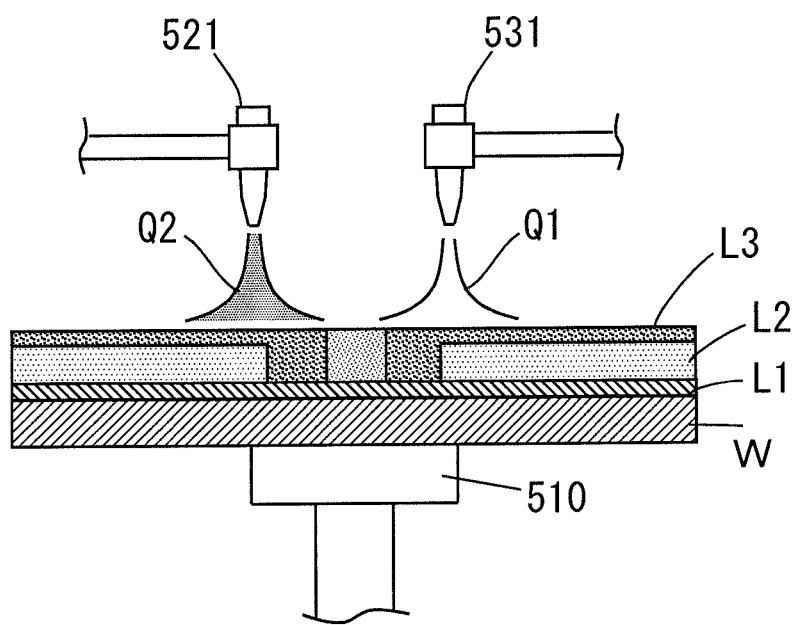

ETCHING DEVICE, SUBSTRATE PROCESSING APPARATUS, ETCHING METHOD AND SUBSTRATE PROCESSING METHOD

BACKGROUND OF THE INVENTION

Field of the Invention

The present invention relates to an etching device that performs etching processing on a substrate, a substrate processing apparatus including the etching device, an etching method for performing the etching processing on the substrate and a substrate processing method including the etching method.

Description of Related Art

Substrate processing apparatuses are used to subject various substrates such as semiconductor substrates, substrates for liquid crystal display devices, plasma displays, optical disks, magnetic disks, magneto-optical disks, photomasks, and other substrates to various types of processing.

In recent years, in order to realize an even finer pattern on the substrate, a DSA (Directed Self Assembly) technique using a microphase separation of a block copolymer has been suggested.

For example, in a pattern forming method described in JP 5918122 B2, a film of a polystyrene (PS)-polymethyl methacrylate (PMMA) block copolymer is formed on a substrate. The film of the block copolymer is heated, so that PS regions and PMMA regions are alternately arranged. The heated film is irradiated with ultraviolet light emitted by an Xe excimer lamp in an atmosphere of an inert gas, and an organic solvent is supplied to the film irradiated with the ultraviolet light. Thus, the PMMA regions in the film dissolve. As a result, a pattern made of the PS regions is acquired on the substrate.

BRIEF SUMMARY OF THE INVENTION

The organic solvent (isopropyl alcohol, for example) supplied to the film irradiated with the ultraviolet light normally has high volatility. Therefore, it is difficult to uniformly supply the organic solvent to the entire film on the substrate, and variations in processing are likely to occur depending on a portion of the film. Although it is possible to inhibit variations in processing by using a large amount of the organic solvent, significant costs are required in that case.

An object of the present invention is to provide an etching device capable of inhibiting variations in etching processing while inhibiting an increase in cost and a substrate processing apparatus including the etching device, and an etching method by which variations in etching processing can be inhibited while an increase in cost is inhibited, and a substrate processing method including the etching method.

An etching device according to one aspect of the present invention that performs etching processing using an organic solvent on a process film that is formed on a substrate and made of a Directed Self Assembly material includes a low-volatile liquid supplier that supplies a low-volatile liquid having volatility lower than volatility of the organic solvent to the process film, and an organic solvent supplier that, after the low-volatile liquid is supplied to the process film by the low-volatile liquid supplier, supplies the organic solvent to the process film with the low-volatile liquid remaining on the process film.

In this etching device, the low-volatile liquid is supplied to the process film on the substrate, and then the organic solvent is supplied to the process film with the low-volatile liquid remaining on the process film. Therefore, the organic solvent is mixed with the low-volatile liquid on the process film. Because the low-volatile liquid has volatility lower than that of the organic solvent, volatilization of the organic solvent is inhibited by the low-volatile liquid. Thus, the organic solvent can be uniformly supplied to the entire process film while an amount of the organic solvent to be used is reduced. Therefore, it is possible to inhibit variations in etching processing in the process film while inhibiting an increase in cost.

Further, because the organic solvent is supplied with the process film wet with the low-volatile liquid, the organic solvent is likely to spread on the process film. Thus, the organic solvent can be supplied to the entire process film in a short period of time. Therefore, uniformity of the etching processing in the process film can be enhanced. Further, because the organic solvent is diluted by the low-volatile liquid, the concentration of the organic solvent can be adjusted to the concentration suitable for the etching processing of the process film.

An amount of the low-volatile liquid to be supplied by the low-volatile liquid supplier and an amount of the organic solvent to be supplied by the organic solvent supplier may be respectively adjusted such that the organic solvent supplied by the organic solvent supplier is diluted on the process film by the low-volatile liquid supplied by the low-volatile liquid supplier to have concentration within a predetermined concentration range.

In this case, the etching processing can be appropriately performed on the process film by the diluted organic solvent.

An etching device according to another aspect of the present invention that performs etching processing using an organic solvent on a process film that is formed on a substrate and made of a Directed Self Assembly material includes an organic solvent supplier that supplies the organic solvent to the process film, and a low-volatile liquid supplier that, during a period in which the organic solvent is supplied to the process film by the organic solvent supplier, supplies a low-volatile liquid having volatility lower than volatility of the organic solvent to the process film.

In this etching device, the low-volatile liquid is supplied while the organic solvent is supplied to the process film on the substrate. Therefore, the organic solvent is mixed with the low-volatile liquid on the process film. Because the low-volatile liquid has volatility lower than that of the organic solvent, volatilization of the organic solvent is inhibited by the low-volatile liquid. Thus, the organic solvent can be uniformly supplied to the entire process film while an amount of the organic solvent to be used is reduced. Therefore, it is possible to inhibit variations in etching processing in the process film while inhibiting an increase in cost.

An etching device according to yet another aspect of the present invention that performs etching processing using an organic solvent on a process film that is formed on a substrate and made of a Directed Self Assembly material includes a mixer that mixes a low-volatile liquid having volatility lower than volatility of the organic solvent with the organic solvent, and an organic solvent supplier that supplies the organic solvent mixed with the low-volatile liquid by the mixer to the process film.

In this etching device, the organic solvent mixed with the low-volatile liquid is supplied to the process film on the substrate. Because the low-volatile liquid has volatility lower than that of the organic solvent, volatilization of the organic solvent is inhibited by the low-volatile liquid. Thus, it is possible to uniformly supply the organic solvent to the entire process film while reducing an amount of the organic solvent to be used. Therefore, it is possible to inhibit variations in etching processing in the process film while inhibiting an increase in cost.

The organic solvent may include isopropyl alcohol, methyl alcohol, ethyl alcohol, acetone or acetic acid. In this case, because volatilization of the organic solvent having high volatility is inhibited by the low-volatile liquid, it is possible to uniformly supply the organic solvent to the entire process film while reducing an amount of the organic solvent to be used.

The low-volatile liquid may include pure water. In this case, it is possible to easily inhibit volatilization of the organic solvent without preventing the action of the organic solvent on the process film.

The etching device may further include a rotation holder that, during a period in which the organic solvent is supplied to the process film by the organic solvent supplier, holds and rotates the substrate on which the process film is formed.

In this case, the organic solvent can easily spread on the process film by a centrifugal force, and the organic solvent and the low-volatile liquid can be efficiently mixed.

The etching device may further include a rinse liquid supplier that, after the organic solvent is supplied by the organic solvent supplier, supplies the low-volatile liquid used as a rinse liquid to the process film with the organic solvent remaining on the process film.

In this case, the organic solvent on the process film is replaced with the rinse liquid, whereby the etching processing of the process film is stopped. Because the low-volatile liquid is used as the rinse liquid, complication of the device and an increase in cost are inhibited.

A substrate processing apparatus according to yet another aspect of the present invention includes a coating device that forms a process film on a substrate by applying a Directed Self Assembly material to the substrate, a thermal processing device that performs thermal processing on the process film formed on the substrate by the coating device, an exposure device that performs exposure processing on the process film on which the thermal processing has been performed by the thermal processing device, and the above-mentioned etching device that performs etching processing on the process film on which the exposure processing has been performed by the exposure device.

In this substrate processing apparatus, the process film made of a Directed Self Assembly material is formed on the substrate, and the thermal processing, the exposure processing and the etching processing are performed on the process film in this order. Thus, a pattern is formed. In this case, because the etching processing is performed by the above-mentioned etching device, it is possible to inhibit variations in etching processing in the process film while inhibiting an increase in cost.

An etching method according to yet another aspect of the present invention for performing etching processing using an organic solvent on a process film that is formed on a substrate and made of a Directed Self Assembly material includes the steps of supplying a low-volatile liquid having volatility lower than volatility of the organic solvent to the process film by a low-volatile liquid supplier, and after the low-volatile liquid is supplied to the process film, supplying the organic solvent to the process film by an organic solvent supplier with the low-volatile liquid remaining on the process film.

In this etching method, volatilization of the organic solvent is inhibited by the low-volatile liquid. Thus, it is possible to uniformly supply the organic solvent to the entire process film while reducing an amount of the organic solvent to be used. Therefore, it is possible to inhibit variations in etching processing in the process film while inhibiting an increase in cost.

An etching method according to yet another aspect of the present invention for performing etching processing using an organic solvent on a process film that is formed on a substrate and made of a Directed Self Assembly material, includes the steps of supplying the organic solvent to the process film by an organic solvent supplier, and during a period in which the organic solvent is supplied to the process film, supplying a low-volatile liquid having volatility lower than volatility of the organic solvent to the process film by a low-volatile liquid supplier.

In this etching method, the volatilization of the organic solvent is inhibited by the low-volatile liquid. Thus, it is possible to uniformly supply the organic solvent to the entire process film while reducing an amount of the organic solvent to be used. Therefore, it is possible to inhibit variations in etching processing in the process film while inhibiting an increase in cost.

An etching method according to yet another aspect of the present invention for performing etching processing using an organic solvent on a process film that is formed on a substrate and made of a Directed Self Assembly material, includes the steps of, in a mixer, mixing a low-volatile liquid having volatility lower than volatility of the organic solvent with the organic solvent, and supplying the organic solvent mixed with the low-volatile liquid to the process film by an organic solvent supplier.

In this etching method, the volatilization of the organic solvent is inhibited by the low-volatile liquid. Thus, it is possible to uniformly supply the organic solvent to the entire process film while reducing an amount of the organic solvent to be used. Therefore, it is possible to inhibit variations in etching processing in the process film while inhibiting an increase in cost.

A substrate processing method according to yet another aspect of the present invention includes the steps of, in a coating device, forming a process film on a substrate by applying a Directed Self Assembly material to the substrate, in a thermal processing device, performing thermal processing on the process film formed on the substrate, in an exposure device, performing exposure processing on the process film on which the thermal processing has been performed, and in an etching device, performing etching processing using the above-mentioned etching method on the process film on which the exposure processing has been performed.

In this substrate processing method, the process film made of a Directed Self Assembly material is formed on the substrate. The thermal processing, the exposure processing and the etching processing are performed on the process film in this order, whereby a pattern is formed. In this case, the etching processing is performed by the above-mentioned etching method, so that it is possible to inhibit variations in etching processing in the process film while inhibiting an increase in cost.

Other features, elements, characteristics, and advantages of the present invention will become more apparent from the following description of preferred embodiments of the present invention with reference to the attached drawings.

BRIEF DESCRIPTION OF THE SEVERAL VIEWS OF THE DRAWING

FIG. 6 is a schematic plan view of a substrate processing apparatus including the etching device of FIG. 1;

FIG. 10 is a diagram for explaining another example of the operation of the etching device of FIG. 1.

DESCRIPTION OF THE PREFERRED EMBODIMENTS

An etching device and a substrate processing apparatus including the etching device, and an etching method and a substrate processing method including the etching method, according to embodiments of the present invention will be described below with reference to drawings. In the following description, a substrate refers to a semiconductor substrate, a substrate for a liquid crystal display device, a substrate for a plasma display, a glass substrate for a photomask, a substrate for an optical disc, a substrate for a magnetic disc, a substrate for a magneto-optical disc, a substrate for a photomask and the like.

(1) Etching Device

Figure 1:
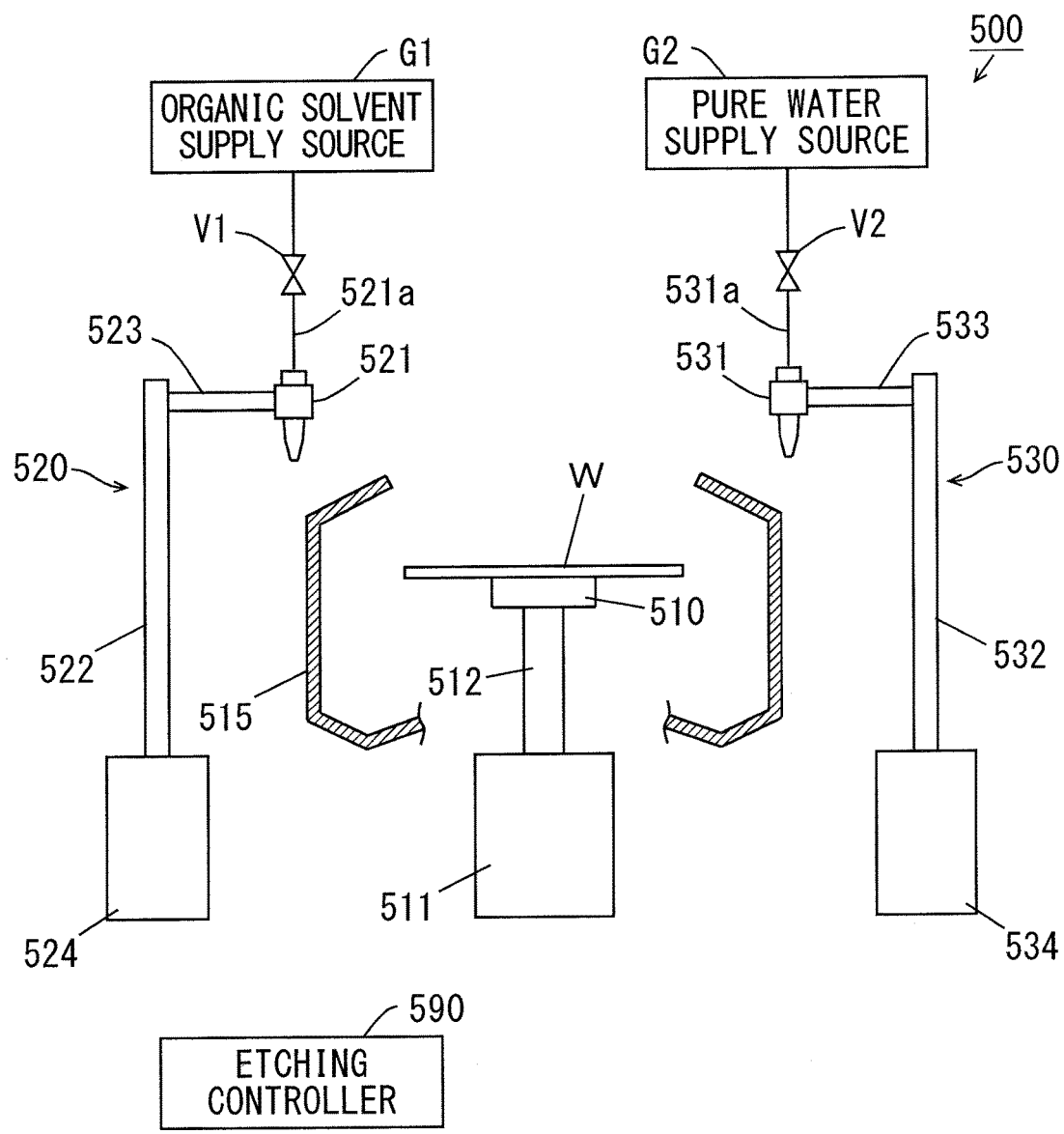
FIG. 1 is a schematic cross sectional view showing a configuration of an etching device according to one embodiment of the present invention.

FIG. 1 is a schematic cross sectional view showing the configuration of the etching device according to one embodiment of the present invention. As shown in FIG. 1, the etching device 500 includes a spin chuck 510, a guard 515, an organic solvent supplier 520 and a pure water supplier 530.

The spin chuck 510 holds the substrate W in a horizontal attitude. The spin chuck 510 is attached to a tip end of a rotation shaft 512 of a motor 511. The motor 511 rotates the spin chuck 510 about a vertical axis. Thus, the substrate W held by the spin chuck 510 is rotated about the vertical axis. The guard 515 is provided to surround the substrate W held by the spin chuck 510 and receives liquid and the like splashed from the rotating substrate W.

The organic solvent supplier 520 includes an organic solvent nozzle 521, nozzle supporters 522, 523 and a nozzle driver 524. The organic solvent nozzle 521 is connected to an organic solvent supply source G1 through a supply pipe 521a. A valve V1 is inserted into the supply pipe 521a. When the valve V1 is opened, an organic solvent is supplied from the organic solvent supply source G1 to the organic solvent nozzle 521 through the supply pipe 521a, and the organic solvent is discharged from the organic solvent nozzle 521. As the organic solvent, isopropyl alcohol, methyl alcohol, ethyl alcohol, acetone or acetic acid is used as the organic solvent, for example.

The nozzle supporter 522 extends in a vertical direction, and the nozzle supporter 523 extends in a horizontal direction from an upper end of the nozzle supporter 522. The organic solvent nozzle 521 is fixed to a tip end of the nozzle supporter 523. The nozzle driver 524 lifts and lowers the nozzle supporter 522 and rotates the nozzle supporter 522 about a vertical axis. Thus, the organic solvent nozzle 521 is lifted, lowered and rotated, and moved between a position above the substrate W and a position outward of the substrate W.

The pure water supplier 530 includes a pure water nozzle 531, nozzle supporters 532, 533 and a nozzle driver 534. The pure water nozzle 531 is connected to a pure water supply source G2 through a supply pipe 531a. A valve V2 is inserted into the supply pipe 531a. When the valve V2 is opened, pure water is supplied from the pure water supply source G2 to the pure water nozzle 531 through the supply pipe 531a, and pure water is discharged from the pure water nozzle 531. In the present example, pure water is used as a low-volatile liquid and a rinse liquid. The low-volatile liquid has volatility lower than that of the organic solvent, and high affinity for the organic solvent. Further, the low-volatile liquid does not chemically react with the organic solvent. As the low-volatile liquid, a function water including carbonic acid ($CO_2$), ozone ($O_3$), hydrogen ($H_2$) or the like may be used instead of pure water.

The nozzle supporter 532 extends in the vertical direction, and the nozzle supporter 533 extends in the horizontal direction from an upper end of the nozzle supporter 532. The pure water nozzle 531 is fixed to a tip end of the nozzle supporter 533. The nozzle driver 534 lifts and lowers the nozzle supporter 532, and rotates the nozzle supporter 532 about a vertical axis. Thus, the pure water nozzle 531 is lifted, lowered and rotated, and moved between a position above the substrate W and a position outward of the substrate W.

The etching device 500 includes an etching controller 590. The etching controller 590 includes a CPU (Central Processing Unit), a ROM (Read Only Memory), a RAM (Random Access Memory) and the like. A control program is stored in the ROM. The CPU controls an operation of each element of the etching device 500 by executing the control program stored in the ROM using the RAM.

(2) Control System of Etching Device

Figure 2:
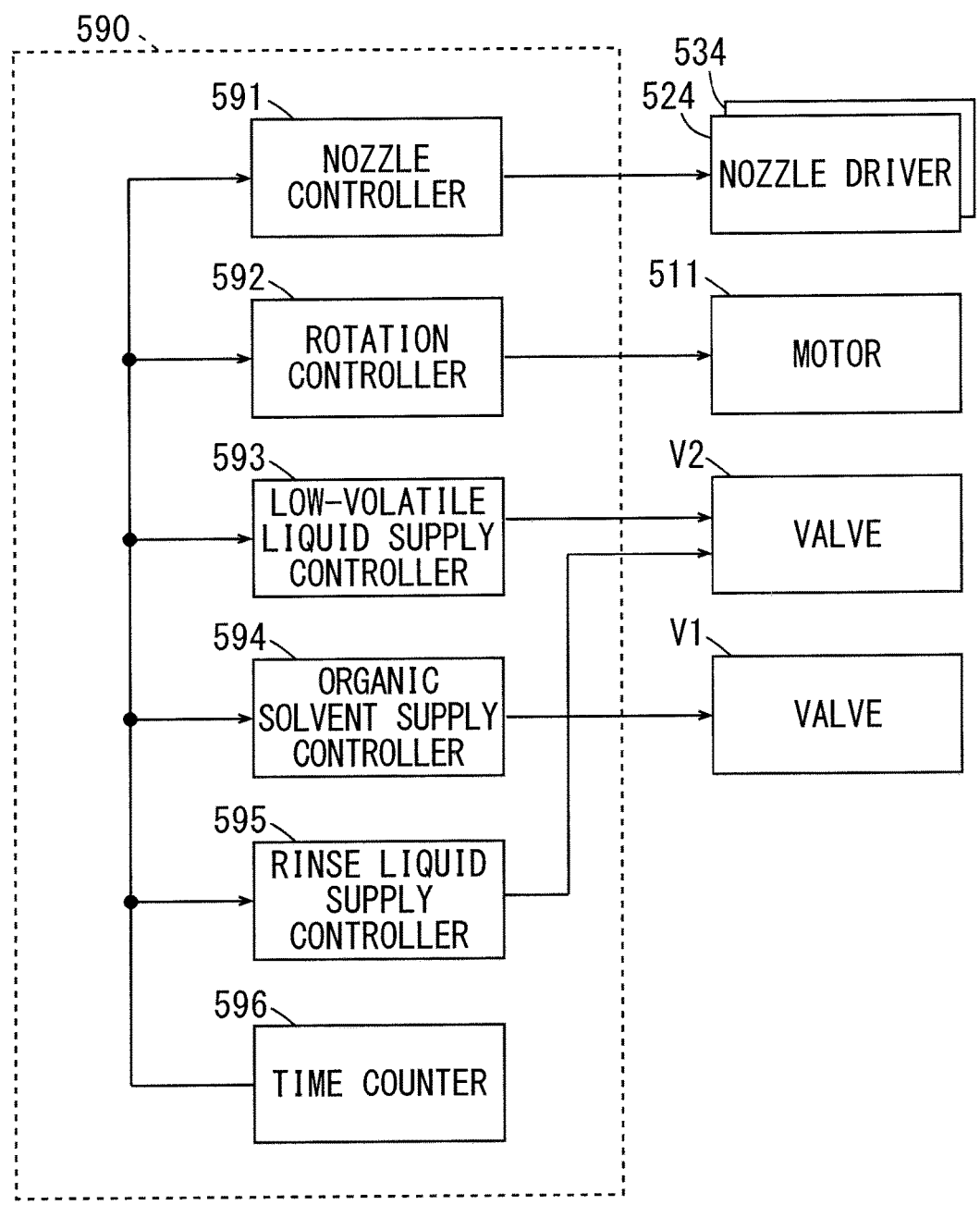
FIG. 2 is a block diagram showing a configuration of a control system of the etching device of FIG. 1.

FIG. 2 is a block diagram showing the configuration of the control system of the etching device 500 of FIG. 1. In FIG. 2, the functional configuration of the etching controller 590 is shown. The etching controller 590 includes a nozzle controller 591, a rotation controller 592, a low-volatile liquid supply controller 593, an organic solvent supply controller 594, a rinse liquid supply controller 595 and a time counter 596. The function of each element of the etching controller 590 of FIG. 2 is realized by execution of the control program by the CPU.

The nozzle controller 591 controls operations of the nozzle drivers 524, 534, and the rotation controller 592 controls an operation of the motor 511. The organic solvent supply controller 594 controls opening and closing of the valve V1, and the low-volatile liquid supply controller 593 and the rinse liquid supply controller 595 control opening and closing of the valve V2. The time counter 596 counts the elapsed time. A time point at which each of the controllers 591 to 595 operates is determined based on the elapsed time that is counted by the time counter 596.

(3) One Example of Substrate Processing Method

FIGS. 3A to 3D are schematic cross sectional views showing one example of the substrate processing method with use of a below-mentioned thermal processing device 300. The step of FIG. 3D of the steps of FIGS. 3A to 3D is performed by the etching device 500 of FIG. 1. In the present example, a method of forming a fine hole pattern is shown.

Figure 3A:
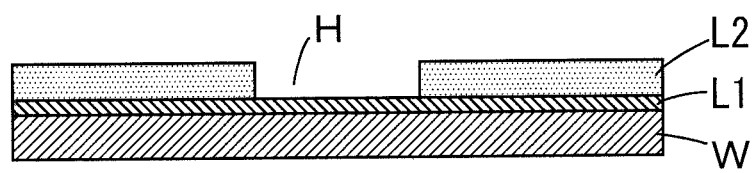
FIGS. 3A to 3D are schematic cross sectional views showing one example of a substrate processing method using the etching device of FIG. 1.
Figure 3B:
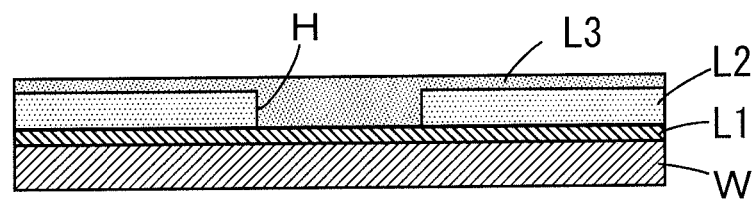

First, as shown in FIG. 3A, an underlayer L1 is formed to cover an upper surface of the substrate W, and a guide pattern L2 made of a photoresist, for example, is formed on the underlayer L1. In the present example, the guide pattern L2 has a circular hole H. Next, as shown in FIG. 3B, a DSA film L3 is formed of a DSA (Directed Self Assembly) material in a region on the upper surface of the guide pattern L2 and a region on the underlayer L1 inside of the hole H of the guide pattern L2. The DSA material is a block copolymer constituted by a plurality of types of polymers. The plurality of types of polymers that constitute the block copolymer is preferably immiscible with one another.

The DSA material constituted by two types of polymers is used in the present embodiment. Combinations of two types of polymers include Polystyrene-Polymethylmethacrylate (PS-PMMA), Polystyrene-Polydimethylsiloxane (PS-PDMS), Polystyrene-Polyferrocenyldimethylsilane (PS-PFS), Polystyrene-Polyethylene oxide (PS-PEO), Polystyrene-Polyvinyl Pyridine (PS-PVP), Polystyrene-Polyhydroxystyrene (PS-PHOST), and Polynnethylnnethacrylate-Polymethacrylate-Polyhedral-Oligomeric-Silsesquioxane (PMMA-PMAPOSS), for example.

Figure 3C:
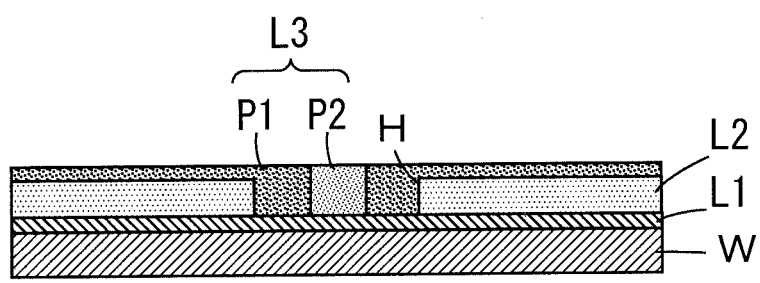

Next, the thermal processing is performed on the substrate W, so that a microphase separation occurs in the DSA film L3 on the substrate W as shown in FIG. 3C. As a result, a pattern P1 made of one polymer and a pattern P2 made of another polymer are formed. In the present example, the pattern P1 is formed to cover the upper surface of the guide pattern L2 and extend along an inner peripheral surface of the circular hole H of the guide pattern L2, and the circular pattern P2 is formed inward of the pattern P1.

Figure 3D:
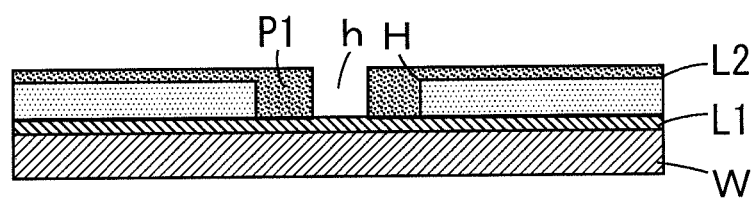

Then, the exposure processing is performed on the entire surface of the DSA film L3 in which the microphase separation has occurred, whereby the one polymer and the other polymer are uncoupled, and the pattern P1 and the pattern P2 are separated from each other. Then, etching processing is performed on the DSA film L3 on the substrate W, so that the pattern P2 is removed as shown in FIG. 3D. Finally, the pattern P1 (the hole pattern) having the circular hole h remains on the substrate W.

(4) Operation of Etching Device 500

Figure 4:
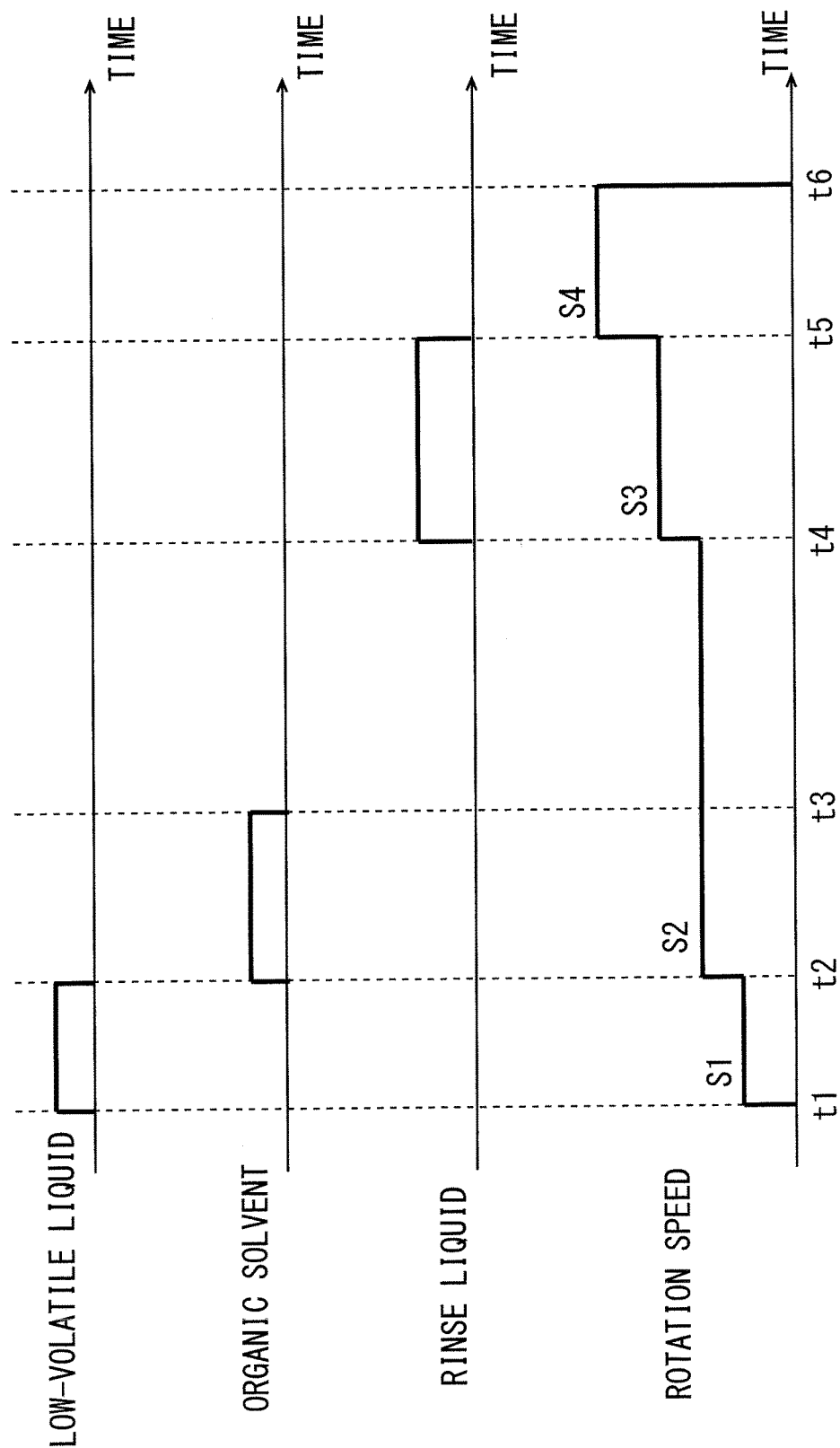
FIG. 4 is a time chart showing an example of an operation of the etching device of FIG. 1.
Figure 5A:
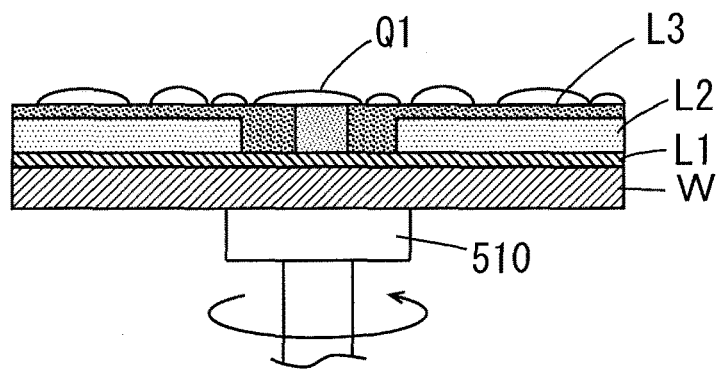
FIGS. 5A to 5C are schematic cross sectional views for explaining the operation of the etching device of FIG. 1.
Figure 5B:
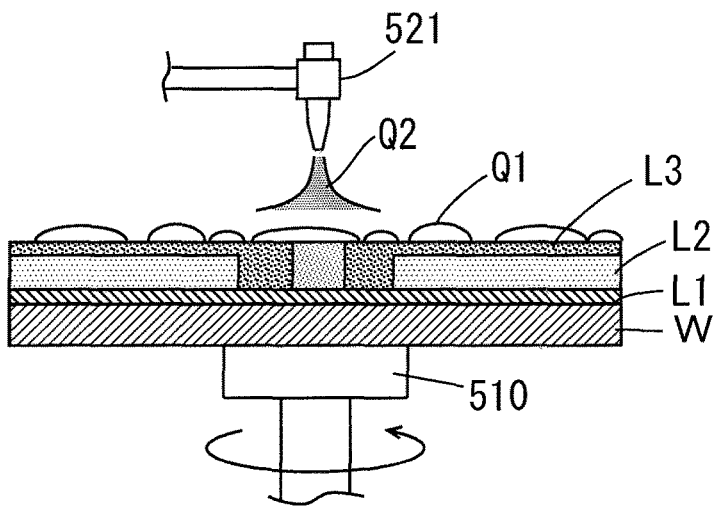
Figure 5C:
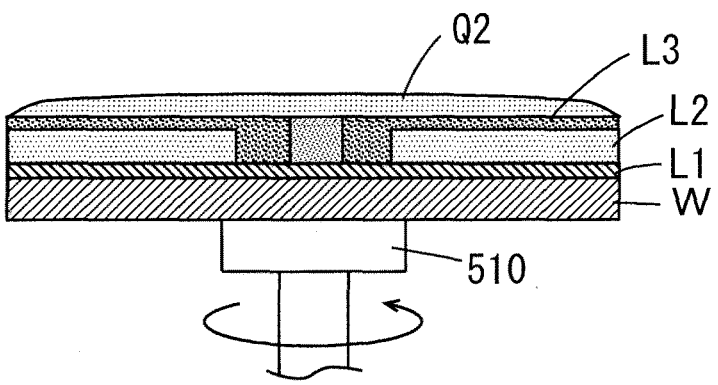

FIG. 4 is a time chart showing an example of the operation of the etching device 500 of FIG. 1. In FIG. 4, the abscissa indicates the time, and the ordinate indicates discharge flow rates of the low-volatile liquid, the organic solvent and the rinse liquid, and a rotation speed of the substrate W. FIGS. 5A to 5C are schematic cross sectional views for explaining the operation of the etching device 500. The operation of the etching device 500 of FIG. 1 will be described below with reference to FIGS. 1, 2, 4, 5A, 5B and 5C.

In the example of FIG. 4, during a period from a time point t1 to a time point t2, pure water used as the low-volatile liquid is supplied onto the substrate W while the substrate W is rotated at a speed S1. In this case, the rotation controller 592 of FIG. 2 controls the motor 511 such that the substrate W is rotated at the speed S1. The nozzle controller 591 allows the pure water nozzle 531 to be moved to a position above the center portion of the substrate W before the time point t1, and allows the pure water nozzle 531 to be moved to a position outward of the substrate W after the time point t2, by controlling the nozzle driver 534. The low-volatile liquid supply controller 593 starts the discharge of pure water from the pure water nozzle 531 by opening the valve V2 at the time point t1, and stops the discharge of pure water from the pure water nozzle 531 by closing the valve V2 at the time point t2. The speed S1 is not less than 0 rpm and not more than 1000 rpm, for example. During the period from the time point t1 to the time point t2, the low-volatile liquid may be supplied to the substrate W with the substrate W being still and not rotated.

As shown in FIG. 5A, after the discharge of the low-volatile liquid is stopped, the low-volatile liquid Q1 remains in a large region on the DSA film L3. The low-volatile liquid Q1 is held on the DSA film L3 without reacting with the DSA film L3.

Subsequently, during a period from the time point t2 to a time point t3 of FIG. 4, the organic solvent is supplied to the substrate W while the substrate W is rotated at a speed S2. In this case, the rotation controller 592 of FIG. 2 controls the motor 511 such that the substrate W is rotated at the speed S2. The nozzle controller 591 allows the organic solvent nozzle 521 to be moved to a position above the center portion of the substrate W before the time point t2, and allows the organic solvent nozzle 521 to be moved to a position outward of the substrate W after a time point t3, by controlling the nozzle driver 524. The organic solvent supply controller 594 starts the discharge of the organic solvent from the organic solvent nozzle 521 by opening the valve V1 at the time point t2, and stops the discharge of the organic solvent from the organic solvent nozzle 521 by closing the valve V1 at the time point t3. The speed S2 is higher than the speed S1, for example, and not less than 100 rpm and not more than 2500 rpm.

As shown in FIG. 5B, the organic solvent Q2 supplied from the organic solvent nozzle 521 to the substrate W is mixed with the low-volatile liquid Q1 remaining on the DSA film L3. In this case, volatilization of the organic solvent Q2 is inhibited on the DSA film L3, so that the organic solvent can be uniformly supplied to the entire DSA film L3 while an amount of the organic solvent Q2 to be used is reduced.

Further, in the case where the organic solvent Q2 is directly supplied to the DSA film L3 without the supply of the low-volatile liquid Q1, the order in which portions of the DSA film L3 are etched is the same as the order in which the organic solvent reaches the portions of the DSA film L3. Therefore, variations in etching processing are likely to occur in a plurality of positions of the DSA film L3. In contrast, because an upper surface of the DSA film L3 is wet with the low-volatile liquid Q1 in the present example, the organic solvent Q2 is likely to spread on the DSA film L3. Thus, the organic solvent Q2 can be supplied to the entire DSA film L3 in a short period of time. Thus, uniformity of the etching processing in the DSA film L3 can be enhanced.

Further, the organic solvent Q2 is diluted by being mixed with the low-volatile liquid Q1. The concentration of the diluted organic solvent Q2 depends on amounts of the low-volatile liquid Q1 and the organic solvent Q2 to be supplied. Then, it is preferable that, a concentration range suitable for the etching processing of the DSA film L3 is determined in advance, and amounts of the low-volatile liquid Q1 and the organic solvent Q2 to be supplied are respectively adjusted such that the organic solvent Q2 is diluted on the DSA film L3 to have concentration within the concentration range. Thus, the etching processing of the DSA film L3 can be more appropriately performed.

Subsequently, during a period from the time point t3 to a time point t4 of FIG. 4, the substrate W is rotated at the speed S2 with the supply of the organic solvent stopped. As shown in FIG. 5C, the diluted organic solvent Q2 is held on the DSA film L3. In this case, the rotation controller 592 of FIG. 2 controls the motor 511 such that the substrate W is rotated at the speed S2.

During the period from the time point t3 to the time point t4, the organic solvent may be held on the substrate W because the substrate W is held still. Further, during a period from the time point t2 to the time point t4, the organic solvent may be continuously supplied to the substrate W. Further, when the organic solvent is supplied to the substrate W, the organic solvent nozzle 521 may be moved between a position above the center portion of the substrate W and a position above a peripheral portion of the substrate W.

Next, during a period from the time point t4 to a time point t5 of FIG. 4, pure water used as the rinse liquid is supplied to the substrate W while the substrate W is rotated at a speed S3. Thus, the organic solvent Q2 on the substrate W is replaced with the rinse liquid, so that the etching of the DSA film L3 is stopped. In this case, the rotation controller 592 of FIG. 2 controls the motor 511 such that the substrate W is rotated at the speed S3. The nozzle controller 591 allows the pure water nozzle 531 to be moved to a position above the center portion of the substrate W before the time point t4, and allows the pure water nozzle 531 to be moved to a position outward of the substrate W after the time point t5, by controlling the nozzle driver 534. The rinse liquid supply controller 595 starts the discharge of pure water from the pure water nozzle 531 by opening the valve V2 at the time point t4, and stops the discharge of pure water from the pure water nozzle 531 by closing the valve V2 at the time point t5. The speed S3 is higher than the speed S2, and is not less than 300 rpm and not more than 3000 rpm, for example.

A discharge flow rate of the rinse liquid during the period from the time point t4 to the time point t5 may be the same as or different from a discharge flow rate of the low-volatile liquid during the period from the time point t1 to the time point t2. Here, the discharge flow rate means an amount of liquid to be discharged per unit time.

Next, the substrate W is rotated at a speed S4 during a period from the time point t5 to a time point t6. Thus, the rinse liquid on the substrate W is removed by a centrifugal force. In this case, the rotation controller 592 of FIG. 2 controls the motor 511 such that the substrate W is rotated at the speed S4. The speed S4 is higher than the speed S3 and not less than 1000 rpm and not more than 4000 rpm, for example.

The etching of the DSA film L3 may be stopped by removal of the organic solvent on the substrate W by the centrifugal force instead of the replacement of the organic solvent on the substrate W with the rinse liquid.

(5) Configuration of Substrate Processing Apparatus

Figure 7:
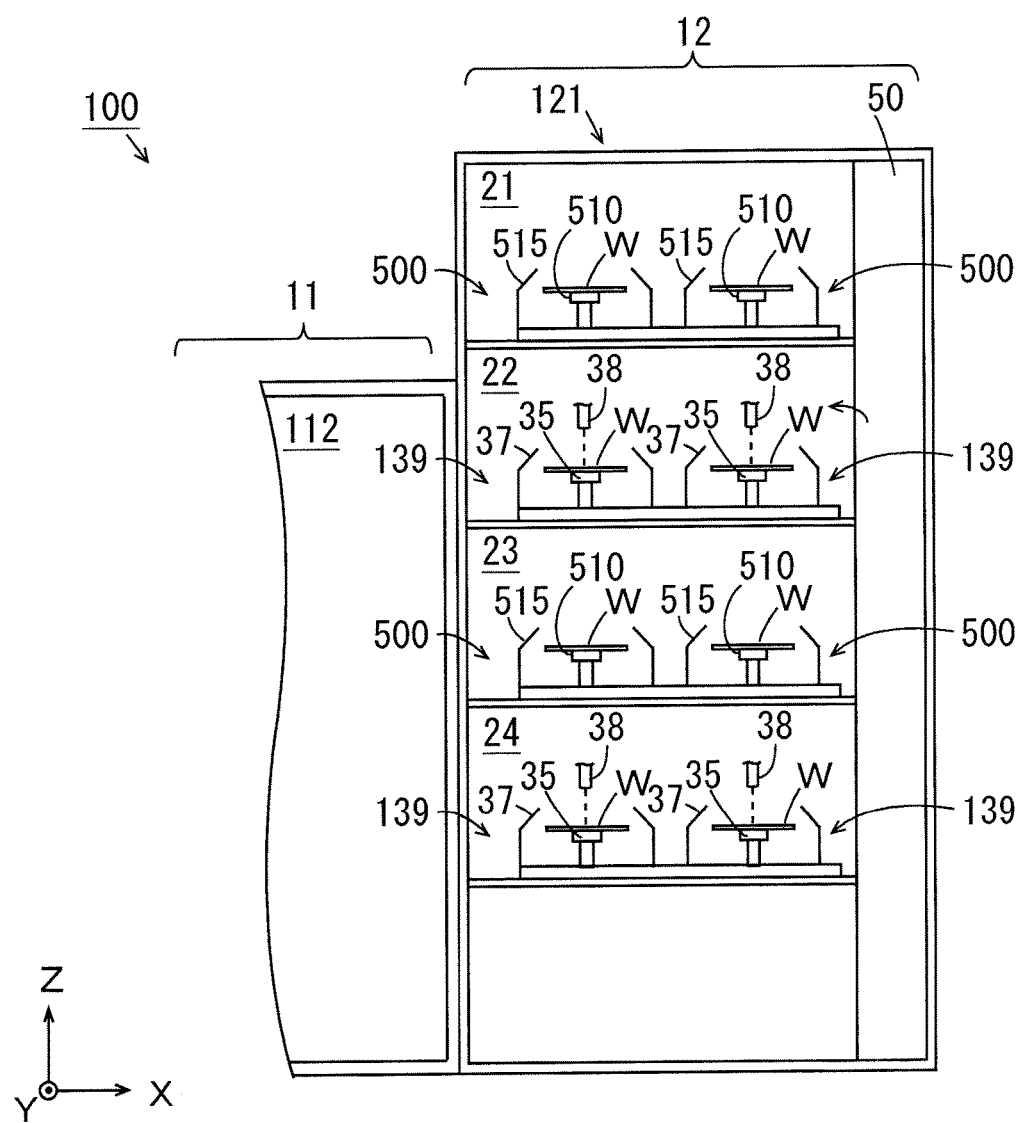
FIG. 7 is a schematic side view of a coating etching processing section of FIG. 6.

FIG. 6 is a schematic plan view of the substrate processing apparatus including the etching device 500 of FIG. 1. FIGS. 6, 7 and subsequent given figures are accompanied by the arrows that indicate X, Y, and Z directions orthogonal to one another for the clarity of a positional relationship. The X and Y directions are orthogonal to each other within a horizontal plane, and the Z direction corresponds to a vertical direction.

As shown in FIG. 6, the substrate processing apparatus 100 includes an indexer block 11 and a processing block 12. The indexer block 11 includes a plurality of carrier platforms 40 and a transport section 112. A carrier C that stores a plurality of substrates W in multiple stages is placed on each of the carrier platforms 40.

Figure 9:
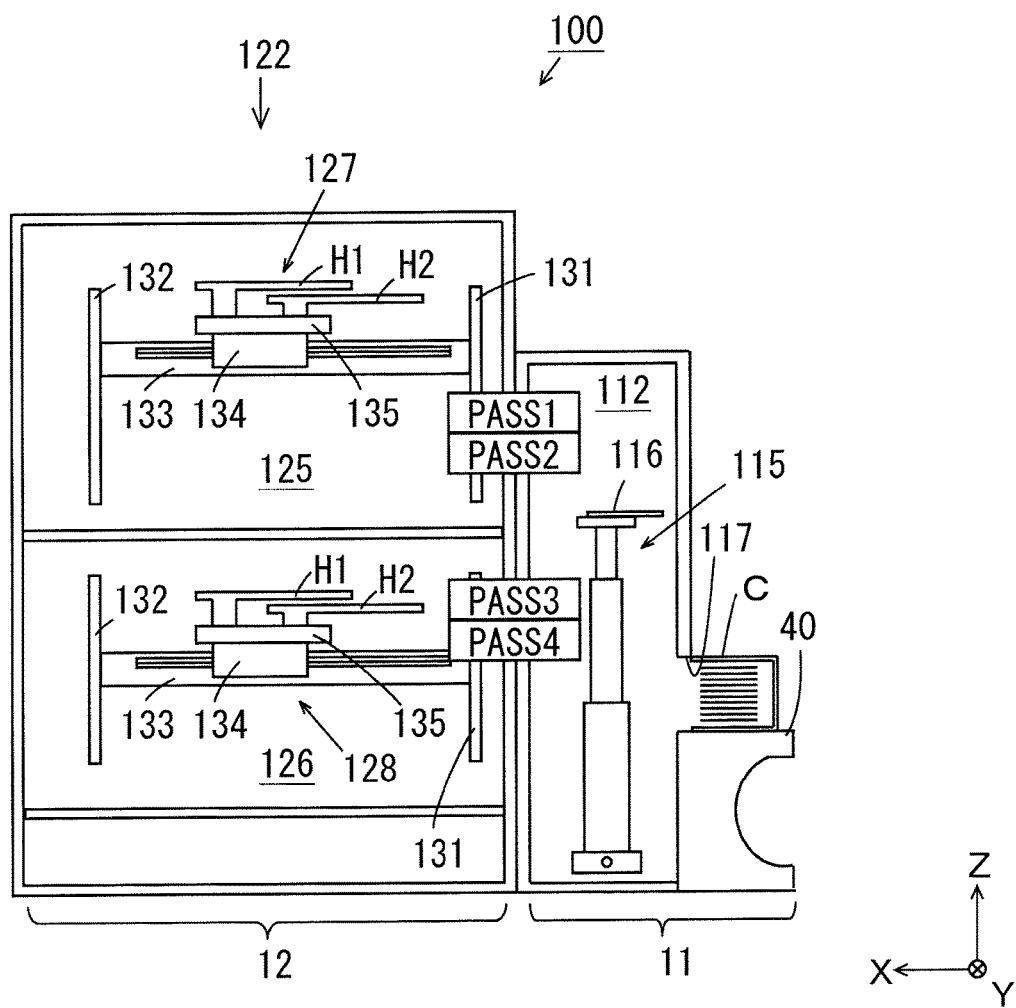
FIG. 9 is a schematic side view of a transport section of FIG. 6.

A transport section 112 is provided with a main controller 114 and a transport mechanism (transport robot) 115. The main controller 114 controls various constituent elements in the substrate processing apparatus 100. The transport mechanism 115 has a hand 116 for holding the substrate W. The transport mechanism 115 holds and transports the substrate W using the hand 116. As shown in FIG. 9, described below, an opening 117 for receiving and transferring the substrate W between the carrier C and the transport mechanism 115 is formed in the transport section 112.

A main panel PN is provided on the side surface of the transport section 112. A user can confirm a processing status of the substrate W in the substrate processing apparatus 100 and the like using the main panel PN. An operation unit (not shown) composed of a keyboard, for example, is provided in the vicinity of the main panel PN. The user can perform operation setting of the substrate processing apparatus 100 and the like by operating the operation unit.

The processing block 12 includes a coating etching processing section 121, a transport section 122 and a thermal processing section 123. The coating etching processing section 121 and the thermal processing section 123 are provided to be opposite to each other with the transport section 122 interposed therebetween. A substrate platform PASS1 and substrate platforms PASS2 to PASS4 (FIG. 9), described below, on which the substrates W are placed, are provided between the transport section 122 and the indexer block 11. A transport mechanism (transport robot) 127 and a transport mechanism (transport robot) 128 (see FIG. 9), described below, that transport the substrates W are provided in the transport section 122.

FIG. 7 is a schematic side view of the coating etching processing section 121 of FIG. 6. As shown in FIG. 7, etching processing chambers 21, 23 and coating processing chambers 22, 24 are provided in a stack in the coating etching processing section 121. In each of the etching processing chambers 21, 23, the above-mentioned etching device 500 is provided. In each of the coating processing chambers 22, 24, a coating device (coater) 139 is provided.

In the present example, two etching devices 500 are provided in each of the etching processing chambers 21, 23, and two coating devices 139 are provided in each of the coating processing chambers 22, 24. Each coating device 139 includes a spin chuck 35 for holding the substrate W and a cup 37 provided to surround the spin chuck 35. The rotation of the spin chuck 35 is driven by a driving device (not shown) (an electric motor, for example). Further, each coating device 139 includes a nozzle 38 for supplying a processing liquid made of the DSA material to the substrate W held by the spin chuck 35.

In each coating device 139 in each of the coating processing chambers 22, 24, the processing liquid is applied to the substrate W, so that a DSA film is formed on the substrate W. In each etching device 500 in each of the etching processing chambers 21, 23, the above-mentioned etching processing is performed on the substrate W on which the DSA film is formed.

As shown in FIGS. 6 and 7, a fluid box 50 is provided at one end of the coating etching processing section 121. The fluid box 50 houses fluid related elements such as a pipe, a joint, a valve, a flowmeter, a regulator, a pump and a temperature adjuster used to supply a processing liquid, pure water and an organic solvent to the etching device 500 and the coating device 139, and discharge liquid and air out of the etching device 500 and the coating device 139.

Figure 8:
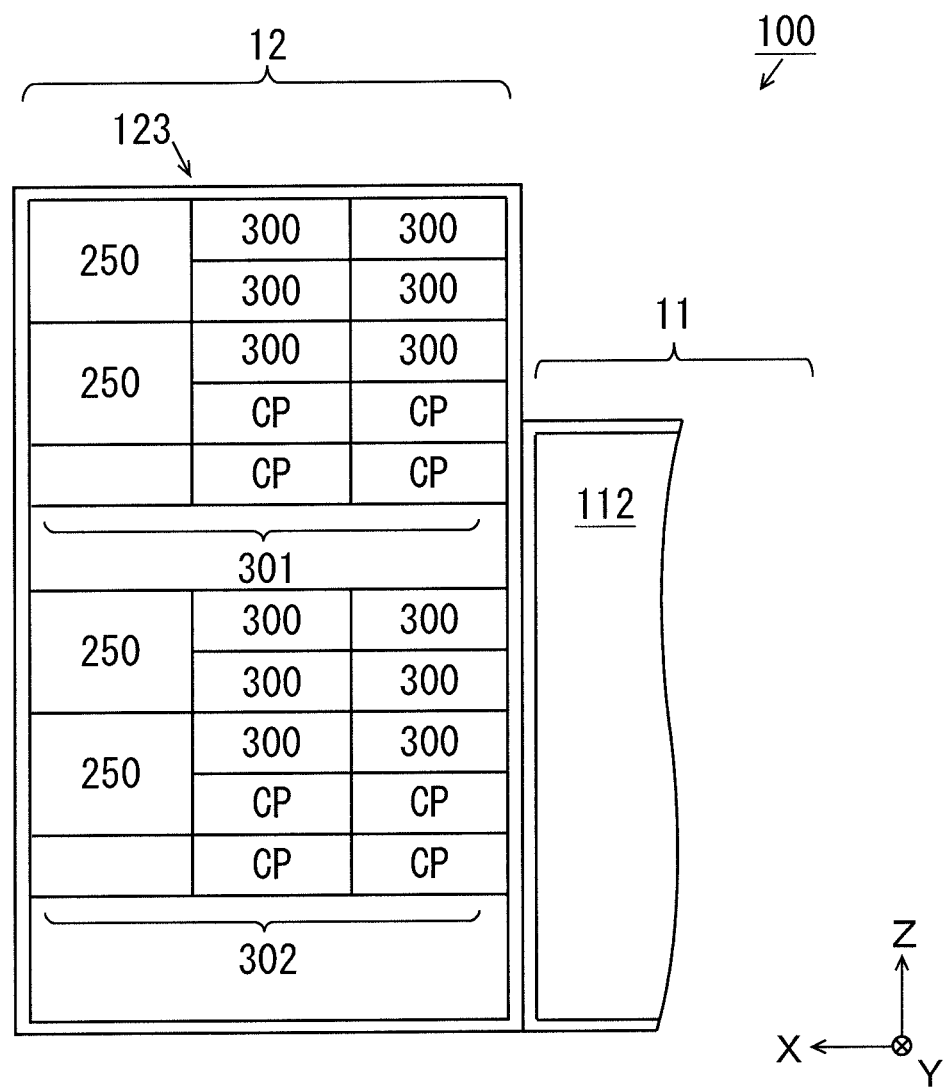
FIG. 8 is a schematic side view of a thermal processing section of FIG. 6.

FIG. 8 is a schematic side view of the thermal processing section 123 of FIG. 6. As shown in FIG. 8, the thermal processing section 123 has an upper thermal processing section 301 provided above and a lower thermal processing section 302 provided below. In each of the upper thermal processing section 301 and the lower thermal processing section 302, a plurality of thermal processing devices 300, a plurality of exposure devices 250 and a plurality of cooling devices (cooling plates) CP are provided.

In each thermal processing device 300, the thermal processing is performed on the substrate W on which the DSA film is formed. In each exposure device 250, the exposure processing is performed on the substrate W on which the thermal processing has been performed. In each cooling device CP, the cooling processing is performed on the substrate W on which the DSA film has not been formed and the substrate W on which the thermal processing has been performed.

FIG. 9 is a schematic side view of the transport sections 112, 122. As shown in FIG. 9, the transport section 122 has an upper transport chamber 125 and a lower transport chamber 126. A transport mechanism 127 is provided in the upper transport chamber 125, and a transport mechanism 128 is provided in the lower transport chamber 126.

The substrate platforms PASS1, PASS2 are provided between the transport section 112 and the upper transport chamber 125, and the substrate platforms PASS3, PASS4 are provided between the transport section 112 and the lower transport chamber 126.

The substrate W to be transported from the indexer block 11 to the processing block 12 is placed on each of the substrate platforms PASS1, PASS3. The substrate W to be transported from the processing block 12 to the indexer block 11 is placed on each of the substrate platforms PASS2, PASS4.

Each of the transport mechanisms 127, 128 includes guide rails 131, 132, 133, a moving member 134, a rotating member 135 and hands H1, H2. The guide rails 131, 132 are respectively provided to extend in an up-and-down direction. The guide rail 133 is provided to extend in the horizontal direction (X direction) between the guide rail 131 and the guide rail 132, and is attached to the guide rails 131, 132 to be movable in the up-and-down direction. The moving member 134 is attached to the guide rail 133 to be movable in the horizontal direction (X direction).

The rotating member 135 is rotatably provided on an upper surface of the moving member 134. The hand H1 and the hand H2 for holding the substrates W are attached to the rotating member 135. The hands H1, H2 are configured to be capable of advancing and retreating with respect to the rotating member 135.

With such a configuration, each of the transport mechanisms 127, 128 can hold the substrate W using the hands H1, H2, and can transport the substrate W by moving in the X and Z directions. The transport mechanism 127 transports the substrate W among the substrate platforms PASS1, PASS2, the etching processing chamber 21 (FIG. 7), the coating processing chamber 22 (FIG. 7) and the upper thermal processing section 301 (FIG. 8). The transport mechanism 128 transports the substrate W among the substrate platforms PASS3, PASS4, the etching processing chamber 23 (FIG. 7), the coating processing chamber 24 (FIG. 7) and the lower thermal processing section 302 (FIG. 8).

(6) Operation of Substrate Processing Apparatus 100

The operation of the substrate processing apparatus 100 will be described. First, the carrier C in which the substrates W in an initial state (FIG. 3A) are stored is placed on the carrier platform 40 (FIG. 6) in the indexer block 11. The transport mechanism 115 alternately transports the substrates W in the initial state from the carrier C to the substrate platform PASS1 and the substrate platform PASS3 (FIG. 9).

The substrate W placed on the substrate platform PASS1 is taken out by the hand H1 of the transport mechanism 127 (FIG. 9). Then, the transport mechanism 127 (FIG. 9) takes out the substrate W on which the cooling processing has been performed from a predetermined cooling device CP in the upper thermal processing section 301 (FIG. 8) using the hand H2 and carries in the substrate W held by the hand H1 to the cooling device CP. In this case, in the cooling device CP, the temperature of the substrate W is adjusted to a temperature suitable for the formation of the DSA film L3.

Next, the transport mechanism 127 (FIG. 9) takes out the substrate W (FIG. 3B) on which the DSA film L3 is formed and which is placed on the spin chuck 35 in the coating processing chamber 22 (FIG. 7) by the hand H1, and places the substrate W on which the cooling processing has been performed and which is held by the hand H2 on the spin chuck 35. In the coating processing chamber 22, the DSA film L3 is formed on the substrate W (FIG. 3B) by the coating device 139 (FIG. 7).

Then, the transport mechanism 127 (FIG. 9) takes out the substrate W (FIG. 3C) on which the thermal processing has been performed from a predetermined thermal processing device 300 in the upper thermal processing section 301 (FIG. 8) by the hand H2, and carries the substrate W on which the DSA film L3 is formed and which is held by the hand H1 into the thermal processing device 300. In the thermal processing device 300, the thermal processing is performed on the substrate W (FIG. 3C).

Then, the transport mechanism 127 (FIG. 9) takes out the substrate W on which the cooling processing has been performed from a predetermined cooling device CP in the upper thermal processing section 301 (FIG. 8) by the hand H1, and carries the substrate W on which the thermal processing has been performed and which is held by the hand H2 into the cooling device CP. In this case, in the cooling device CP, the temperature of the substrate W is adjusted to a temperature suitable for the exposure processing.

Next, the transport mechanism 127 (FIG. 9) takes out the substrate W on which the exposure processing has been performed from a predetermined exposure device 250 in the upper thermal processing section 301 (FIG. 8) by the hand H2, and carries the substrate W on which the cooling processing has been performed and which is held by the hand H1 into the exposure device 250. In the exposure device 250, the exposure processing is performed on the substrate W on which the thermal processing has been performed.

Then, the transport mechanism 127 (FIG. 9) takes out the substrate W (FIG. 3D) on which the etching processing has been performed and which is placed on the spin chuck 515 in the etching processing chamber 21 (FIG. 7) by the hand H1, and places the substrate W on which the exposure processing has been performed and which is held by the hand H2 on the spin chuck 515. In the etching processing chamber 21, the etching processing is performed by the etching device 500 on the substrate W on which the exposure processing has been performed (FIG. 3D). Thereafter, the transport mechanism 127 places the substrate W on which the etching processing has been performed and which is held by the hand H1 on the substrate platform PASS2 (FIG. 9).

The transport mechanism 127 repeats the above-mentioned processing, whereby predetermined processing is continuously performed on a plurality of substrates W in the processing block 15.

The transport mechanism 128 carries in the substrate W to and carries out the substrate W from the substrate platforms PASS3, PASS4, the etching processing chamber 23, the coating processing chamber 24 and the lower thermal processing section 302 by the operation similar to that of the transport mechanism 127. In each of the etching processing chamber 23, the coating processing chamber 24 and the lower thermal processing section 302, the operation similar to that of each of the etching processing chamber 21, the coating processing chamber 22 and the upper thermal processing section 301 is performed.

In this manner, in the present embodiment, the substrate W transported by the transport mechanism 127 is processed in the etching processing chamber 21, the coating processing chamber 22 and the upper thermal processing section 301, and the substrate W transported by the transport mechanism 128 is processed in the etching processing chamber 23, the coating processing chamber 24 and the lower thermal processing section 302. In this case, processing for the substrate W in an upper processing section (the etching processing chamber 21, the coating processing chamber 22 and the upper thermal processing section 301) and processing for the substrate W in a lower processing section (the etching processing chamber 23, the coating processing chamber 24 and the lower thermal processing section 302) can be concurrently performed.

(7) Effects

In the etching device 500 according to the present embodiment, the low-volatile liquid is supplied to the DSA film L3 on the substrate W, and then the organic solvent is supplied to the DSA film L3 with the low-volatile liquid remaining on the DSA film L3. Therefore, the organic solvent is mixed with the low-volatile liquid on the DSA film L3. Because the low-volatile liquid has the volatility lower than that of the organic solvent, volatilization of the organic solvent is inhibited by the low-volatile liquid. Thus, the organic solvent can be uniformly supplied to the entire DSA film L3 while an amount of the organic solvent to be used is reduced. Therefore, it is possible to inhibit variations in etching processing in the DSA film L3 while inhibiting an increase in cost.

Further, because the organic solvent is supplied with the DSA film L3 wet with the low-volatile liquid, the organic solvent is likely to spread on the DSA film L3. Thus, the organic solvent can be supplied to the entire DSA film L3 in a short period of time. Therefore, uniformity of the etching processing in the DSA film L3 can be enhanced. Further, because the organic solvent is diluted by the low-volatile liquid, the concentration of the organic solvent can be adjusted to the concentration suitable for the etching processing of the DSA film L3.

Further, in the present embodiment, the organic solvent is supplied to the DSA film L3 while the substrate W is rotated by the spin chuck 510. Thus, the organic solvent can easily spread on the DSA film L3 by a centrifugal force, and the organic solvent and the low-volatile liquid can be efficiently mixed.

Further, in the present embodiment, pure water is used as both the low-volatile liquid and the rinse liquid. Thus, it is possible to achieve the uniformity of the etching processing while inhibiting the complication of the device and an increase in cost.

(8) Another Example of Operation of Etching Device

FIG. 10 is a diagram for explaining another example of the operation of the etching device 500 of FIG. 1. As for the example of FIG. 10, differences from the example of FIGS. 4, 5A, 5B and 5C will be described. In the example of FIGS. 4, 5A, 5B and 5C, the low-volatile liquid Q1 is supplied onto the substrate W, and then the organic solvent Q2 is supplied onto the substrate W. On the other hand, in the example of FIG. 10, the organic solvent Q2 is supplied onto the substrate W from the organic solvent nozzle 521 while the low-volatile liquid Q1 is supplied onto the substrate W from the pure water nozzle 531. A period during which the low-volatile liquid Q1 is supplied and a period during which the organic solvent Q2 is supplied do not have to coincide with each other completely. That is, a time point at which the supply of the low-volatile liquid Q1 starts and a time point at which the supply of the organic solvent Q2 starts may be different from each other. Alternatively, a time point at which the supply of the low-volatile liquid Q1 ends and a time point at which the supply of the organic solvent Q2 ends may be different from each other. Further, at least one of the pure water nozzle 531 and the organic solvent nozzle 521 may discharge the low-volatile liquid or the organic solvent onto the substrate W while being moved above the substrate W.

Also in the present example, the low-volatile liquid Q1 and the organic solvent Q2 are mixed on the DSA film L3, so that volatilization of the organic solvent Q2 is inhibited. Thus, it is possible to uniformly supply the organic solvent to the entire DSA film L3 while reducing an amount of the organic solvent to be used. Therefore, it is possible to inhibit variations in etching processing in the DSA film L3 while inhibiting an increase in cost.

Further, the organic solvent Q2 easily spreads on the DSA film L3. Thus, the organic solvent Q2 can be supplied to the entire DSA film L3 in a short period of time. Therefore, the uniformity of the etching processing in the DSA film L3 can be enhanced. Further, it is possible to dilute the organic solvent Q2 to have the concentration suitable for the etching processing of the DSA film L3 by respectively adjusting amounts of the low-volatile liquid Q1 and the organic solvent Q2 to be supplied.

(9) Another Example of Configuration of Etching Device

Figure 11:
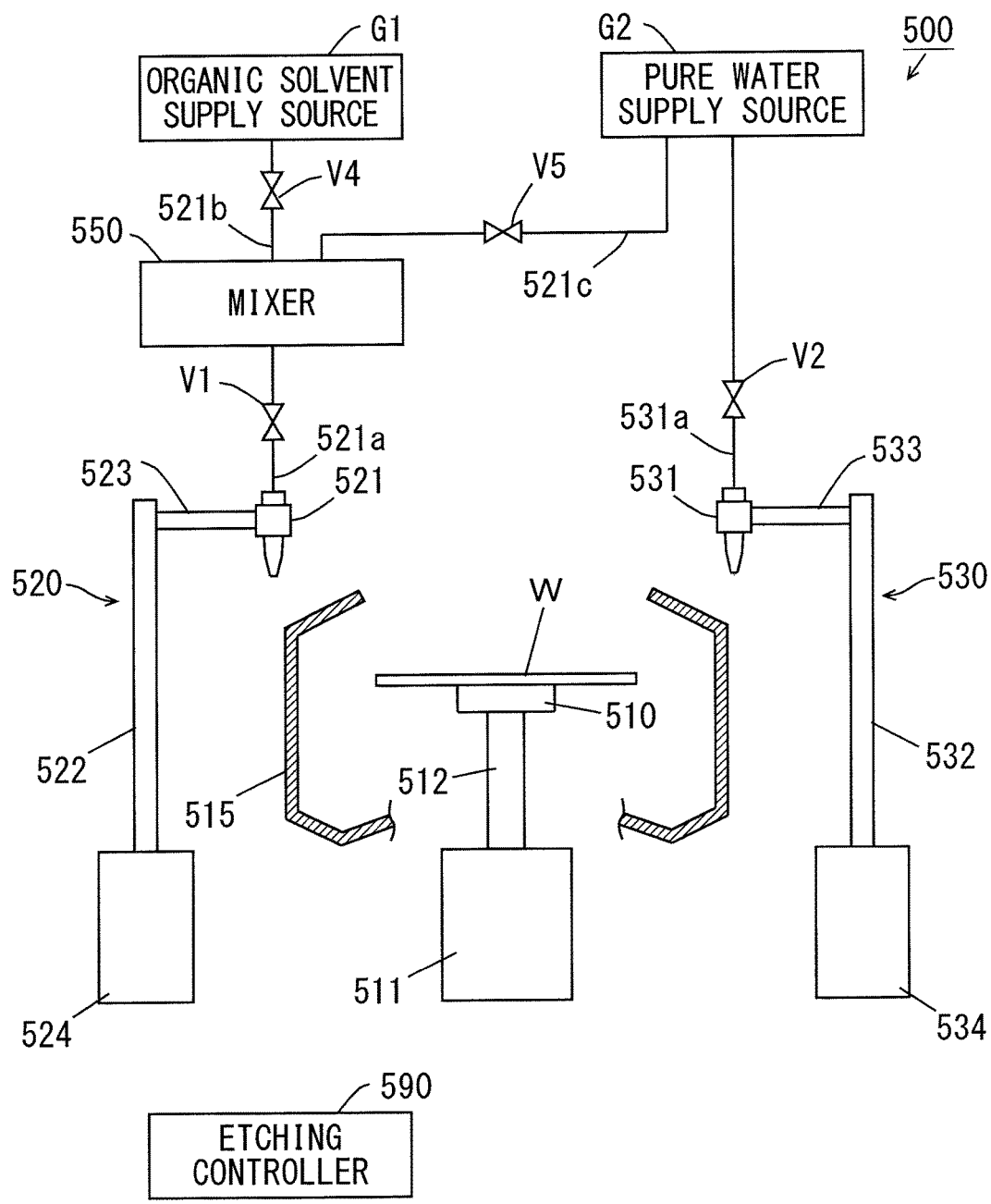
FIG. 11 is a schematic cross sectional view showing another example of the configuration of the etching device.

FIG. 11 is a schematic cross sectional view showing another example of the configuration of the etching device 500. As for the etching device 500 of FIG. 11, differences from the etching device 500 of FIG. 1 will be described. The etching device 500 of FIG. 11 further includes a mixer 550. The organic solvent nozzle 521 is connected to the mixer 550 through the supply pipe 521a. The mixer 550 is connected to the organic solvent supply source G1 through a supply pipe 521b, and is connected to the pure water supply source G2 through a supply pipe 521c. A valve V4 is inserted into the supply pipe 521b, and a valve V5 is inserted into the supply pipe 521c.

When the valve V4 is opened, the organic solvent is supplied from the organic solvent supply source G1 to the mixer 550 through the supply pipe 521b. When the valve V5 is opened, pure water used as the low-volatile liquid is supplied from the pure water supply source G2 to the mixer 550 through the supply pipe 521c.

The mixer 550 mixes the low-volatile liquid supplied from the pure water supply source G2 with the organic solvent supplied from the organic solvent supply source G1. In this case, a mixture ratio of the organic solvent and the low-volatile liquid is preferably adjusted such that the organic solvent is diluted to have the concentration within the concentration range suitable for the etching processing of the DSA film L3 (FIGS. 3A to 3D).

When the valve V1 is opened, the organic solvent (hereinafter referred to as a mixed organic solvent) mixed with the low-volatile liquid is supplied from the mixer 550 to the organic solvent nozzle 521 through the supply pipe 521a. Thus, the mixture organic solvent is discharged from the organic solvent nozzle 521.

During the etching processing, the mixed organic solvent is supplied onto the substrate W instead of the sequential supply of the low-volatile liquid and the organic solvent onto the substrate W. Also in this case, because the volatilization of the organic solvent is inhibited, it is possible to uniformly supply the organic solvent to the entire DSA film L3 while reducing an amount of the organic solvent to be used. Therefore, it is possible to inhibit variations in etching processing in the DSA film L3 while inhibiting an increase in cost. Further, the concentration of the mixed organic solvent can be adjusted to the concentration suitable for the etching processing of the DSA film L3.

(10) Other Embodiments

While pure water is supplied as the low-volatile liquid and the rinse liquid by the common pure water supplier 530 in the above-mentioned embodiment, a low-volatile liquid supplier that supplies the low-volatile liquid and a rinse liquid supplier that supplies the rinse liquid may be provided separately. Further, different liquids may be used as the low-volatile liquid and the rinse liquid.

While the substrate processing apparatus 100 includes the coating devices 139, the exposure devices 250 and the thermal processing devices 300 in the above-mentioned embodiment, at least one of the coating deices 139, the exposure devices 250 and the thermal processing devices 300 may be provided as an external device of the substrate processing apparatus 100.

(11) Correspondences Between Constituent Elements in Claims and Parts in Preferred Embodiments In the following paragraphs, non-limiting examples of correspondences between various elements recited in the claims below and those described above with respect to various preferred embodiments of the present invention are explained.

In the above-mentioned embodiment, the etching device 500 is an example of an etching device, the DSA film L3 is an example of a process film, the pure water supplier 530 is an example of a low-volatile liquid supplier and a rinse liquid supplier, the organic solvent supplier 520 is an example of an organic solvent supplier, the mixer 550 is an example of a mixer, the spin chuck 510 is an example of a rotation holder, the substrate processing apparatus 100 is an example of a substrate processing apparatus, the coating device 139 is an example of a coating device, the thermal processing device 300 is an example of a thermal processing device, and the exposure device 250 is an example of an exposure device.

As each of constituent elements recited in the claims, various other elements having configurations or functions described in the claims can be also used.

While preferred embodiments of the present invention have been described above, it is to be understood that variations and modifications will be apparent to those skilled in the art without departing the scope and spirit of the present invention. The scope of the present invention, therefore, is to be determined solely by the following claims.

INDUSTRIAL APPLICABILITY

The present invention can be utilized for processing for various types of substrates.

We claim:

1. An etching device that performs etching processing using an organic solvent on a process film that is formed on a substrate and made of a Directed Self Assembly material, comprising:
   a pure water supplier that supplies only pure water to the process film;
   an organic solvent supplier that, after the pure water is supplied to the process film by the pure water supplier, supplies the organic solvent to the process film with the pure water remaining on the process film; and
   a rinse liquid supplier that, after the organic solvent is supplied by the organic solvent supplier, supplies the pure water used as a rinse liquid to the process film with the organic solvent remaining on the process film.

2. The etching device according to claim 1, wherein an amount of the pure water to be supplied by the pure water supplier and an amount of the organic solvent to be supplied by the organic solvent supplier are respectively adjusted such that the organic solvent supplied by the organic solvent supplier is diluted on the process film by the pure water supplied by the pure water supplier to have concentration within a predetermined concentration range.

3. The etching device according to claim 1, wherein the organic solvent includes isopropyl alcohol, methyl alcohol, ethyl alcohol, acetone or acetic acid.

4. The etching device according to claim 1, further comprising a rotation holder that, during a period in which the organic solvent is supplied to the process film by the organic solvent supplier, holds and rotates the substrate on which the process film is formed.

5. A substrate processing apparatus comprising:
   a coating device that forms a process film on a substrate by applying a Directed Self Assembly material to the substrate;

a thermal processing device that performs thermal processing on the process film formed on the substrate by the coating device;

an exposure device that performs exposure processing on the process film on which the thermal processing has been performed by the thermal processing device; and an etching device that performs etching processing on the process film on which the exposure processing has been performed by the exposure device, the etching device including a pure water supplier that supplies only pure water to the process film, and an organic solvent supplier that, after the pure water is supplied to the process film by the pure water supplier, supplies an organic solvent to the process film with the pure water remaining on the process film.

6. An etching device that performs etching processing using an organic solvent on a process film that is formed on a substrate and made of a Directed Self Assembly material, comprising:

an organic solvent supplier that supplies the organic solvent to the process film;

a low-volatile liquid supplier that, during a period in which the organic solvent is supplied to the process film by the organic solvent supplier, supplies a low-volatile liquid having volatility lower than volatility of the organic solvent to the process film; and a rinse liquid supplier that, after the organic solvent is supplied by the organic solvent supplier, supplies the low-volatile liquid used as a rinse liquid to the process film with the organic solvent remaining on the process film.

7. The etching device according to claim 6, wherein the organic solvent includes isopropyl alcohol, methyl alcohol, ethyl alcohol, acetone or acetic acid.

8. The etching device according to claim 6, wherein the low-volatile liquid includes pure water.

9. The etching device according to claim 6, further comprising a rotation holder that, during a period in which the organic solvent is supplied to the process film by the organic solvent supplier, holds and rotates the substrate on which the process film is formed.

10. A substrate processing apparatus comprising:

a coating device that forms a process film on a substrate by applying a Directed Self Assembly material to the substrate;

a thermal processing device that performs thermal processing on the process film formed on the substrate by the coating device;

an exposure device that performs exposure processing on the process film on which the thermal processing has been performed by the thermal processing device; and an etching device that performs etching processing on the process film on which the exposure processing has been performed by the exposure device, the etching device including an organic solvent supplier that supplies an organic solvent to the process film, and a low-volatile liquid supplier that, during a period in which the organic solvent is supplied to the process film by the organic solvent supplier, supplies a low-volatile liquid having volatility lower than volatility of the organic solvent to the process film.

11. An etching method including the steps of:

supplying only pure water to a process film that is formed on a substrate and made of a Directed Self Assembly material by a pure water supplier; and after the pure water is supplied to the process film, supplying an organic solvent to the process film by an organic solvent supplier with the pure water remaining on the process film.

12. A substrate processing method including the steps of:

in a coating device, forming a process film on a substrate by applying a Directed Self Assembly material to the substrate;

in a thermal processing device, performing thermal processing on the process film formed on the substrate:

in an exposure device, performing exposure processing on the process film on which the thermal processing has been performed; and in an etching device, performing etching processing using the etching method according to claim 11 on the process film on which the exposure processing has been performed.

13. An etching method including the steps of:

supplying an organic solvent to a process film that is formed on a substrate and made of a Directed Self Assembly material by an organic solvent supplier; and during a period in which the organic solvent is supplied to the process film, supplying a low-volatile liquid having volatility lower than volatility of the organic solvent to the process film by a low-volatile liquid supplier.

14. A substrate processing method including the steps of:

in a coating device, forming a process film on a substrate by applying a Directed Self Assembly material to the substrate;

in a thermal processing device, performing thermal processing on the process film formed on the substrate:

in an exposure device, performing exposure processing on the process film on which the thermal processing has been performed; and in an etching device, performing etching processing using the etching method according to claim 13 on the process film on which the exposure processing has been performed.

* * * * *